US007661466B2

(12) United States Patent
Li et al.

(10) Patent No.: US 7,661,466 B2
(45) Date of Patent: Feb. 16, 2010

(54) HEAT SINK ASSEMBLY HAVING A FIN ALSO FUNCTIONING AS A SUPPORTING BRACKET

(75) Inventors: Wei Li, Shenzhen (CN); Yi-Qiang Wu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 274 days.

(21) Appl. No.: 11/737,100

(22) Filed: Apr. 18, 2007

(65) Prior Publication Data

US 2008/0257527 A1 Oct. 23, 2008

(51) Int. Cl.

| | |
|---|---|
| ***F28D 15/00*** | (2006.01) |
| ***H05K 7/20*** | (2006.01) |
| ***H01L 23/34*** | (2006.01) |

(52) U.S. Cl. .................. 165/104.33; 257/715; 361/700

(58) Field of Classification Search ............ 165/104.33; 361/700; 257/715

See application file for complete search history.

(56) References Cited

U.S. PATENT DOCUMENTS

| | | | | |
|---|---|---|---|---|
| 7,093,648 | B1 * | 8/2006 | Cheng | 165/104.33 |
| 7,215,548 | B1 * | 5/2007 | Wu et al. | 361/703 |
| 7,249,626 | B2 * | 7/2007 | Hao et al. | 165/104.33 |
| 7,443,676 | B1 * | 10/2008 | Li | 361/700 |
| 7,443,679 | B2 * | 10/2008 | Li et al. | 361/704 |
| 7,447,035 | B2 * | 11/2008 | Liu et al. | 361/719 |
| 2005/0082041 | A1 * | 4/2005 | Chen et al. | 165/104.33 |
| 2006/0082972 | A1 * | 4/2006 | Kim | 361/709 |
| 2008/0121372 | A1 * | 5/2008 | Zhou et al. | 165/80.3 |
| 2008/0128111 | A1 * | 6/2008 | Zhou et al. | 165/80.3 |
| 2008/0128118 | A1 * | 6/2008 | Chen et al. | 165/104.33 |
| 2008/0135215 | A1 * | 6/2008 | Wu | 165/104.33 |
| 2008/0144286 | A1 * | 6/2008 | Li et al. | 361/701 |
| 2008/0314556 | A1 * | 12/2008 | Zhou et al. | 165/80.3 |

* cited by examiner

*Primary Examiner*—Cheryl J Tyler
*Assistant Examiner*—Brandon M Rosati
(74) *Attorney, Agent, or Firm*—Frank R. Niranjan

(57) ABSTRACT

A heat sink assembly (100) for cooling a heat-generating electronic component, includes a base plate (32), a plurality of fins (50) mounted on the base plate and a heat pipe (20) thermally connecting the base plate and the fins. The fins are parallel to the base plate and include a bottom fin (40) supporting the fins on the base plate. The bottom fin includes a plurality of supporting tabs (422) engaging with the base plate and separating a body (42) of the bottom fin from the base plate. The bottom fin can be used not only for dissipating heat into a surrounding environment but also for reinforcing the whole strength of the heat sink assembly.

11 Claims, 6 Drawing Sheets

HEAT SINK ASSEMBLY HAVING A FIN ALSO FUNCTIONING AS A SUPPORTING BRACKET

BACKGROUND OF THE INVENTION

1. Field of the Invention

The present invention relates to a heat sink assembly having a plurality of fins, wherein at least one fin functions as a supporting bracket to reinforce the whole strength of the heat sink assembly.

2. Description of related art

Nowadays, numerous heat sinks are used to dissipate heat generated by electronic devices. A tower type heat sink is a common structure of the heat sinks. The tower type heat sink generally comprises a base, a plurality of fins parallel to the base and a heat pipe thermally connecting the base and the fins. The heat sink has a relatively high height. Thus, the heat sink is prone to becoming deformed when subjected to shock or vibration during transportation or use.

Thus, it is desired to devise a heat sink which has a strengthened structure to improve deformation-resistance thereof.

SUMMARY OF THE INVENTION

According to a preferred embodiment of the present invention, a heat sink assembly for cooling a heat-generating electronic component includes a base plate, a plurality of fins mounted on the base plate and a heat pipe thermally connecting the base plate and the fins. The fins are parallel to the base plate and include a bottom fin supporting the fins on the base plate. The bottom fin includes a plurality of supporting tabs extending downwards therefrom to engage with the base plate. The bottom fin functions not only for dissipating heat into a surrounding environment but also for reinforcing the whole strength of the heat sink assembly.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
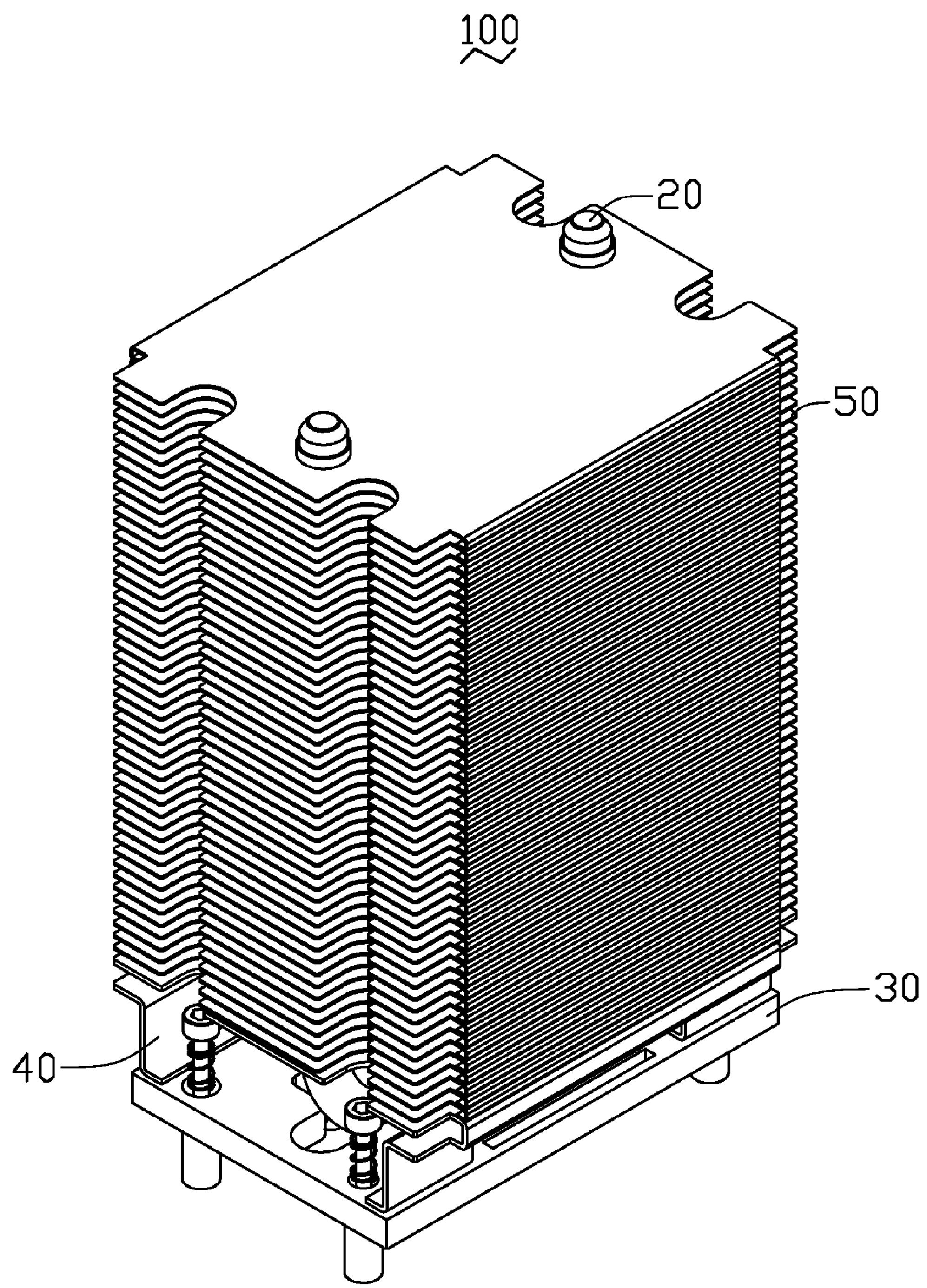
FIG. 1 is an assembled view of a heat sink assembly in accordance with a preferred embodiment of the present invention.
Figure 2:
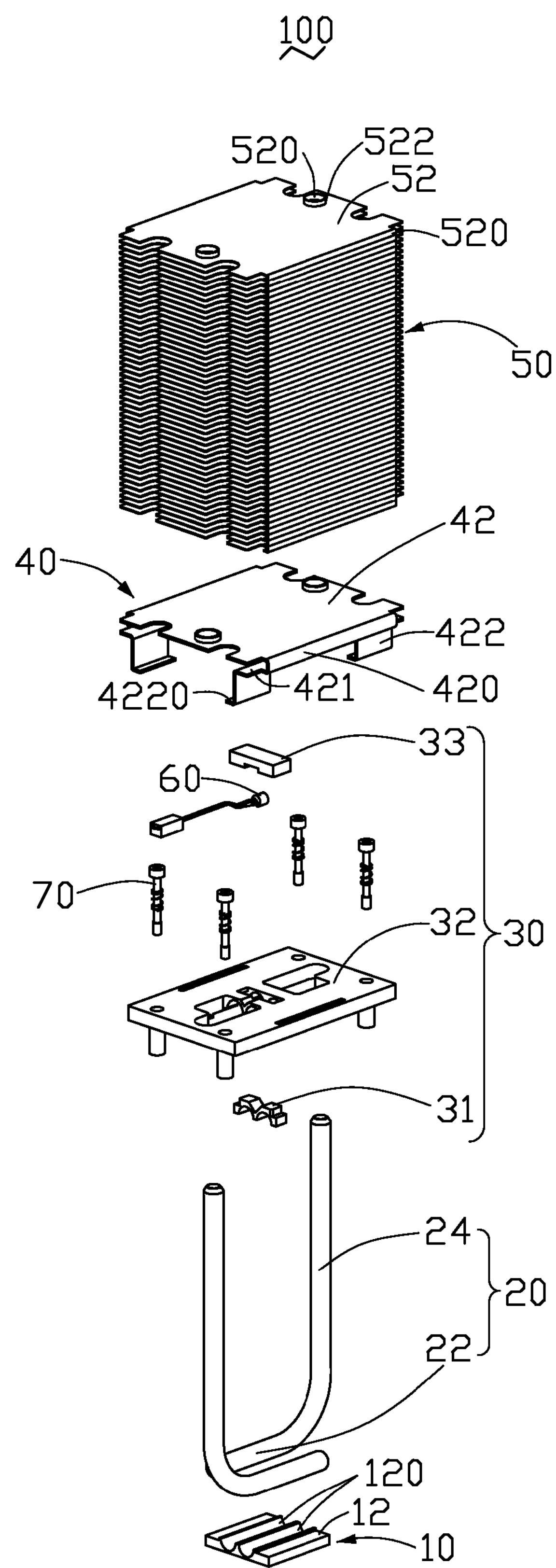
FIG. 2 is an exploded view of the heat sink assembly of FIG. 1.

FIGS. 1-2 show a heat sink assembly 100 in accordance with a preferred embodiment of the present invention. The heat sink assembly 100 is to be mounted on a printed circuit board (not shown) for dissipating heat generated by an electronic device (not shown) attached on the printed circuit board.

The heat sink assembly 100 comprises a heat spreader 10 adapted for contacting with the electronic device, a pair of heat pipes 20, a seat 30, a supporting bracket 40 and a fin assembly 50. The heat pipes 20 thermally connect the heat spreader 10, the seat 30, the supporting bracket 40 and the fin assembly 50.

The heat spreader 10 has a bottom face (not labeled) for contacting the electronic device mounted on the printed circuit board to absorb heat therefrom, and a top face 12 with a pair of parallel and adjoining grooves 120.

Each heat pipe 20 comprises a horizontal evaporating portion 22 and a vertical condensing portion 24 arranged in such a manner that the heat pipe 20 has an L-shaped configuration. The condensing portion 24 extends perpendicularly from one of free ends of the evaporating portion 22. The evaporating portions 22 of the heat pipes 20 are soldered in the grooves 120 of the heat spreader 10. The condensing portions 24 are located at opposite lateral sides of the heat spreader 10, and extend through the seat 30, the supporting bracket 40 and the fin assembly 50.

Figure 3:
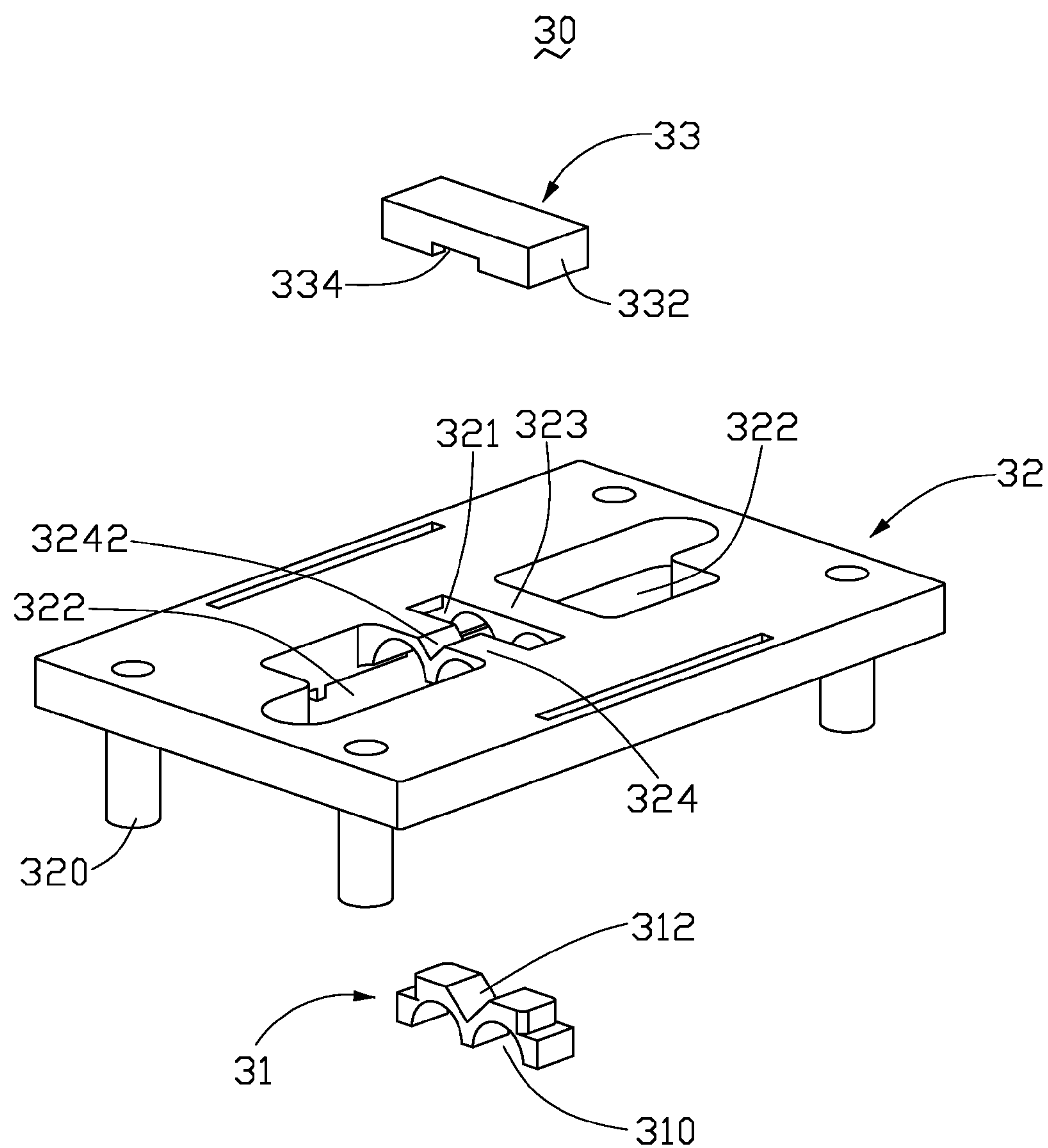
FIG. 3 is an enlarged isometric view of a seat of the heat sink assembly of FIG. 2.
Figure 4:
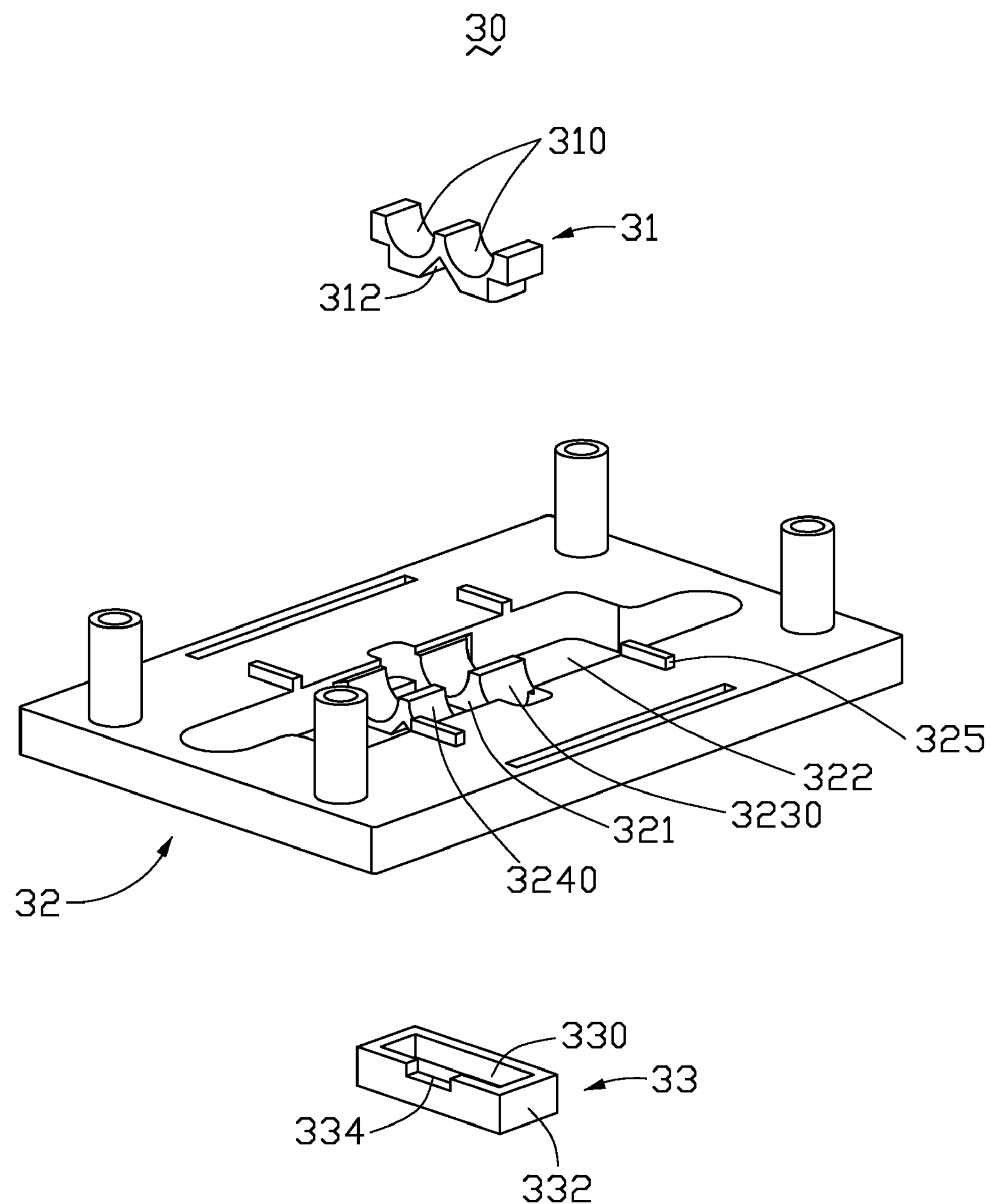
FIG. 4 is an enlarged isometric view of the seat of the heat sink assembly of FIG. 3, but shown from a bottom aspect.

Also referring to FIGS. 3-4, the seat 30 comprises a base plate 32, a connecting element 31 and a protecting element 33 attached to the base plate 32. A temperature sensor 60 (shown in FIG. 2) is mounted between the connecting element 31 and the protecting element 33, for controlling a speed of a fan (not shown) mounted on the heat sink assembly 100. The base plate 32 has a rectangular configuration and is made of metallic material, such as aluminum. Four poles 320 extend downwardly from four corners of the base plate 32, for providing passage for corresponding fasteners 70 to mount the seat 30 on the printed circuit board. A rectangular through slot 321 is defined in a central portion of the base plate 32 for receiving the connecting element 31 therein. A pair of openings 322 are defined at both flanks of the slot 321 for receiving the evaporating portions 22 and curved portions (not labeled) of the heat pipes 20. Two beams 323, 324 are formed between the slot 321 and the openings 322. The beam 324 defines a V-shaped slot 3242 at a top thereof for providing passage for a signal wire of the sensor 60. Each of the beams 323, 324 defines a pair of adjoining semicircular grooves 3230, 3240 at a bottom thereof. The heat spreader 10 is mounted on a bottom of the two beams 323, 324. The semicircular grooves 120 of the heat spreader 10 are in vertical alignment with the semicircular grooves 3230, 3240 of the beams 323, 324. Four bars 325 are formed on the bottom of the base plate 32, for preventing movement of the heat spreader 10 relative to the base plate 32 of the seat 30.

The connecting element 31 is received in the slot 321 of the base plate 32. The connecting element 31 defines a pair of semicircular grooves 310 horizontally in alignment with the grooves 3230, 3240 of the base plate 32. These grooves 310, 3230, 3240 and the grooves 120 of the heat spreader 10 cooperatively define a pair of channels (not labeled) for receiving the evaporating portions 22 of the heat pipes 20 therein. The connecting element 31 defines a V-shaped slot 312 at a top portion thereof horizontally in alignment with the slot 3242 of the beam 324 of the base plate 32.

The protecting element 33 is mounted on the base plate 32 and engages with the connecting element 31. The protecting element 33 has a rectangular configuration and defines a rectangular receiving space 330 defined by four sidewalls 332 of the protecting element 33. The receiving space 330 and the V-shaped slot 312 of the connecting element 31 cooperatively receiving the sensor 60 therein. A cutout 334 is defined at a bottom edge of one of the sidewalls 322 of the protecting element 33 for facilitating passage of the signal wire of the sensor 60.

Referring to FIG. 2 again, the fin assembly 50 comprises a plurality of fins each having a flat body 52 parallel to the base plate 32. The bodies 52 of the fins are perforated with through holes 520. Each of the through holes 520 has its respective annular sidewall 522 that is formed during punching. The condensing portions 24 of the heat pipes 20 are received in the through holes 520 and soldered to the sidewalls 522 so that the fin assembly 50 are combined with the condensing portions 24 of the heat pipes 20. The fin assembly 50 has a bottom fin functioning as the supporting bracket 40. The supporting bracket 40 supports the fin assembly 50 on the base plate 32 of the seat 30 and reinforces the whole strength of the fin assembly 50, in addition to its original function of heat dissipation.

The supporting bracket 40 also has a body 42 with a configuration similar to that of each of the bodies 52 of the fins. A pair of opposite sidewalls 420 extend perpendicularly and downwardly from front and rear edges of the body 42. A pair of connecting walls 421 are bent inwards and horizontally from edges of the sidewalls 420. A pair of L-shaped supporting tabs 422 respectively extend downwardly and vertically from an edge of each connecting wall 421. The two pairs of supporting tabs 422 are located at opposite ends of the body 42. A flat engaging portion 4220 is formed horizontally and inwardly at a free end of each supporting tab 422 for engaging with a top surface of the base plate 32.

In assembly of the preferred embodiment of the present invention, the evaporating portions 22 of the heat pipes 20 are received in the bottom of the base plate 32 after the connecting element 31 is mounted on the base plate 32 of the seat 30. The heat spreader 10 is attached on the bottom of the base plate 32 and engages with the evaporating portions 22 of the heat pipes 20. The protecting element 33 covers the connecting element 31 after the sensor 60 is received in the connecting element 31. The supporting bracket 40 and the fin assembly 50 are mounted on the base plate 32 of the seat 30 in series. The condensing portions 24 are extended through the supporting bracket 40 and the fin assembly 50 simultaneously. Thus, the heat sink assembly 100 is assembled together.

Figure 5:
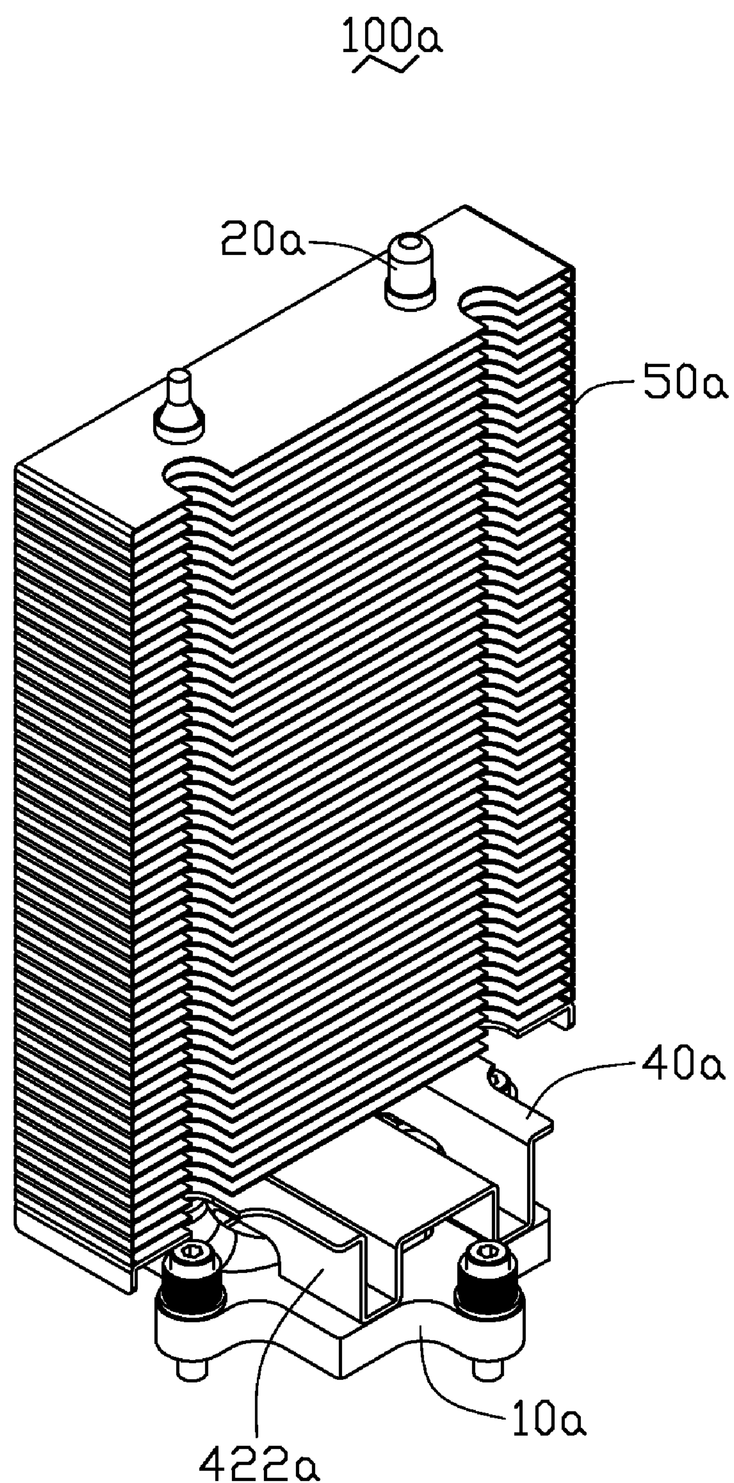
FIG. 5 is an assembled view of a heat sink assembly in accordance with a second embodiment of the present invention.
Figure 6:
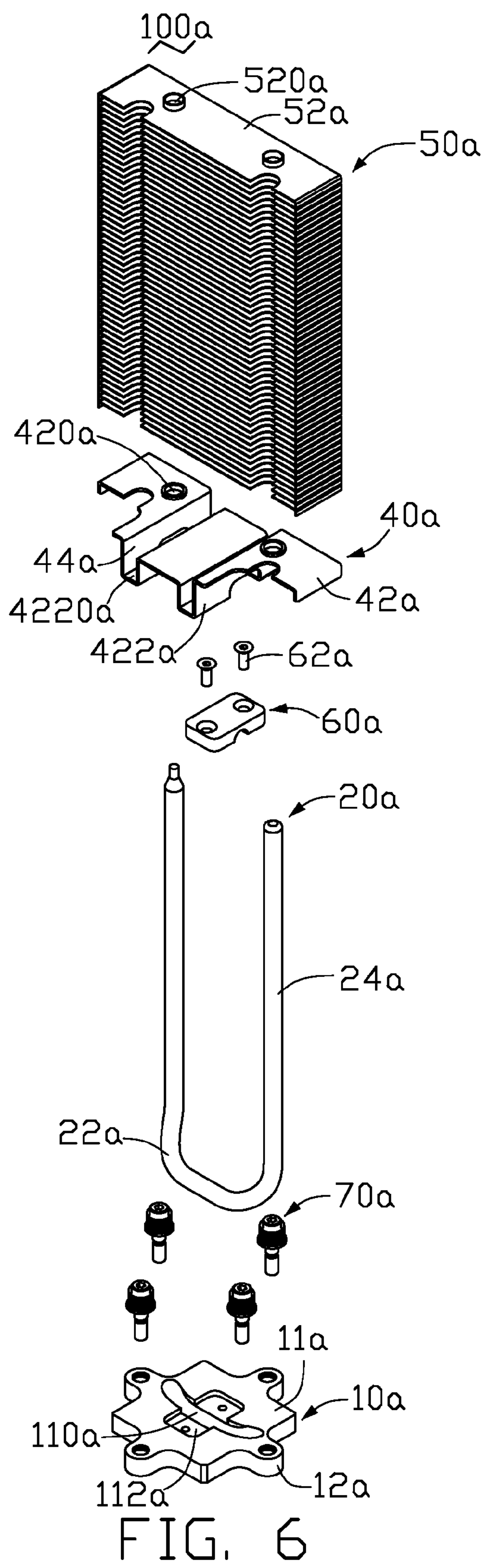
FIG. 6 is an exploded view of the heat sink assembly of FIG. 5.

Referring to FIGS. 5-6, a heat sink assembly 100*a* according to a second embodiment of the present invention is shown. The heat sink assembly 100*a* in the second embodiment comprises a base plate 10*a*, a heat pipe 20*a*, a fixing block 60*a*, a supporting bracket 40*a* and a fin assembly 50*a*. The heat pipe 20*a* thermally connects the base plate 10*a*, the fixing block 60*a*, the supporting bracket 40*a* and the fin assembly 50*a*.

The base plate 10*a* has a square body 11*a*. Four ears 12*a* extend horizontally from a center of each sidewall of the body 11*a*. Four corresponding fasteners 70*a* extend through the four ears 12*a* for mounting the heat sink assembly 100*a* onto a printed circuit board (not shown). An arced slot 110*a* and a rectangular slot 112*a* are defined crossing in the body 11*a*. The slots 110*a*, 112*a* are both defined at a central portion of the body 11*a*. The slot 110*a* is deeper than the slot 112*a*.

The heat pipe 20*a* comprises an arced evaporating portion 22*a* and a pair of vertical condensing portions 24*a* perpendicularly extending from two opposite ends of the evaporating portion 22*a*. The evaporating portion 22*a* of the heat pipe 20*a* is received in the slot 110*a* of the base plate 10*a*. The fixing block 60*a* is received in the slot 112*a* of the base plate 10*a*. A pair of rivets 62*a* extend through the fixing block 60*a* and engage in the base plate 10*a* to mount the fixing block 60*a* onto the evaporating portion 22*a* of the heat pipe 20*a*.

The fin assembly 50*a* comprises a plurality of fins each having a flat body 52*a* parallel to the base plate 10*a*. Each flat body 52*a* is perforated with a pair of through holes 520*a*. The condensing portions 24*a* of the heat pipe 20*a* are soldered in the through holes 520*a* so that the fins are joined with the heat pipes 20*a*. The fin assembly 50*a* has a bottom fin functioning as the supporting bracket 40*a* to support the fin assembly 50 on the base plate 10*a* and reinforce the strength of the fin assembly 50*a*. The supporting bracket 40*a* has a portion corresponding to and vertically in alignment with each body 52*a* of the fin assembly 50*a*, and another portion extending beyond the body 52*a*. The supporting bracket 40*a* has a top surface 42*a* parallel to each body 52*a* of the fin assembly 50*a*. A pair of spaced through holes 420*a* are defined at the top surface 42*a* of the supporting bracket 40*a* and vertically in alignment with the through holes 520 of the fin assembly 50*a*. The top surface 42*a* of the supporting bracket 40*a* is stamped downwardly to form a pair of U-shaped supporting tabs 422*a* located below the top surface 42*a*. The supporting tabs 422*a* traverse between the two condensing portions 24*a* of the heat pipes 20*a*. Each U-shaped supporting tabs 422*a* defines a corresponding U-shaped recess 44*a*. Each of the supporting tabs 422*a* comprises a flat engaging portion 4220*a* engaging with a top surface of the base plate 10*a*.

In the present invention, by the provision of the supporting brackets 40, 40*a* formed by the bottom fin of the fin assembly 50, 50*a*, the fin assembly 50, 50*a* can be firmly mounted to the base plate 30/base plate 10*a*. Thus, strength of the heat sink assembly is increased.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly comprising:

a base plate for absorbing heat generated by a heat-generating electronic component;

a plurality of parallel fins mounted on and thermally connecting with the base plate for dissipating heat from the base plate, said fins comprising a bottom fin having a body parallel to the base plate and a plurality of supporting tabs extending downwardly from the body; and a heat pipe thermally connecting the base plate and the fins;

wherein the supporting tabs engage with a top surface of the base plate to support the fins onto the base plate and reinforce a whole strength of the heat sink assembly; and wherein a top surface of the base plate defines a first slot receiving an evaporating portion of the heat pipe and a second slot crossing the first slot, and the heat sink assembly further comprises a fixing block engaged in the second slot and mounted onto the evaporating portion of the heat pipe.

2. The heat sink assembly as claimed in claim 1, wherein the evaporating portion of the heat pipe is horizontal and sandwiched between the base plate and the bottom fin and the heat pipe further comprises a pair of vertical condensing portions extending through the fins.

3. The heat sink assembly as claimed in claim 2, wherein a top surface of the bottom fin of the fins is stamped downwardly to form the supporting tabs located below the top surface of the bottom fin.

4. The heat sink assembly as claimed in claim 3, wherein the supporting tabs traverse between the two condensing portions of the heat pipe define U-shaped recesses.

5. A heat sink assembly adapted for dissipating heat generated by a heat-generated electronic component, the heat sink assembly comprising:

a base plate;

a plurality of fins mounted on and thermally connecting with the base plate, each of the fins parallel to a top surface of the base plate;

a supporting bracket mounted between the base plate and the fins for supporting the fins on the base plate, the supporting bracket comprising a flat body and a plurality of supporting tabs engaging with the top surface of the base plate, the supporting tabs separating the body of the supporting bracket and the base plate; and a heat pipe comprising an evaporating portion engaging with the base plate and at least a condensing port ion extending through the fins and the supporting bracket and thermally connecting therewith;

wherein a top surface of the base plate defines a first slot receiving the evaporating portion of the heat pipe and a second slot crossing the first slot, and the heat sink assembly further comprises a fixing block engaged in the second slot and mounted onto the evaporating portion of the heat pipe.

6. The heat sink assembly as claimed in claim 5, wherein the top surface of the supporting bracket of the fins is stamped downwardly to form the supporting tabs located below the top surface of the supporting bracket.

7. The heat sink assembly as claimed in claim 6, wherein the supporting tabs are U-shaped and define recesses, the heat pipe has a pair of condensing portions and the supporting tabs traverse between the pair of condensing portions of the heat pipe.

8. A heat sink assembly comprising:

a base plate for thermally connecting with a heat-generating electronic component;

a plurality of fins parallel to the base plate and located above the base plate, wherein a bottom one of the fins having at least a tab extending downwardly to engage with the base plate, thereby reinforcing connection strength between the fins and the base plate; and at least a heat pipe having an evaporating portion thermally engaging with the base plate and condensing portion extending through the fins and thermally connecting therewith whereby heat of the base plate absorbed from the heat-generating electronic component is transferred to the fins via the heat pipe to be dissipated to ambient air;

wherein a top surface of the base plate defines a first slot receiving the evaporating portion of the at least a heat pipe and a second slot crossing the first slot, and the heat sink assembly further comprises a fixing block engaged in the second slot and mounted onto the evaporating portion of the at least a heat pipe.

9. The heat sink assembly as claimed in claim 8, wherein a top surface of the bottom one of the fins is stamped downwardly to form the at least a tab located below said top surface.

10. The heat sink assembly as claimed in claim 9, wherein the at least a tab is U-shaped and defines a recess, the at least a heat pipe has a pair of condensing portions and the at least a tab traverses between the pair of condensing portions of the heat pipe.

11. The heat sink assembly as claimed in claim 10, wherein the evaporating portion of the at least a heat pipe is sandwiched between the base plate and the bottom one of the fins.

* * * * *